United States Patent
Hu et al.

(10) Patent No.: US 7,436,871 B2
(45) Date of Patent: Oct. 14, 2008

(54) METHOD AND DEVICE FOR PERFORMING WAVELENGTH MODULATION WITH DISTRIBUTED BRAGG REFLECTOR (DBR) LASER

(75) Inventors: Martin H Hu, Painted Post, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 332 days.

(21) Appl. No.: 11/002,978

(22) Filed: Dec. 3, 2004

(65) Prior Publication Data

US 2006/0120416 A1 Jun. 8, 2006

(51) Int. Cl.
  H01S 3/10 (2006.01)
  H01S 3/13 (2006.01)
  H01S 3/00 (2006.01)
  H01S 5/00 (2006.01)

(52) U.S. Cl. ............... 372/50.11; 372/26; 372/29.014; 372/29.016; 372/38.01; 372/38.02; 372/38.07

(58) Field of Classification Search .......... 372/26, 372/29.014, 29.016, 38.01, 38.02, 38.07, 372/50.011

See application file for complete search history.

(56) References Cited

U.S. PATENT DOCUMENTS

| | | | | |
|---|---|---|---|---|
| 4,719,636 A * | 1/1988 | Yamaguchi | ............ | 372/50.121 |
| 4,720,835 A * | 1/1988 | Akiba et al. | ............. | 372/50.11 |
| 4,747,107 A * | 5/1988 | Miller | ..................... | 372/44.01 |
| 5,222,071 A * | 6/1993 | Pezeshki et al. | ............... | 372/26 |
| 5,416,629 A * | 5/1995 | Huber | ......................... | 398/187 |
| 5,920,361 A | 7/1999 | Gibeau et al. | | |
| 6,031,860 A * | 2/2000 | Nitta et al. | ............... | 372/50.11 |
| 6,434,175 B1 | 8/2002 | Zah | | |
| 6,496,299 B2 | 12/2002 | Yamamoto et al. | | |
| 6,650,675 B2 | 11/2003 | Sahara et al. | | |
| 6,687,267 B2 | 2/2004 | Bukkems | | |
| 6,690,688 B2 | 2/2004 | Gotoda | | |
| 6,738,398 B2 * | 5/2004 | Hirata et al. | ................... | 372/32 |
| 6,963,685 B2 * | 11/2005 | Mahgerefteh et al. | ......... | 385/37 |
| 7,376,161 B2 * | 5/2008 | Fujii et al. | ..................... | 372/21 |
| 2001/0005388 A1 * | 6/2001 | Hirata et al. | ................... | 372/22 |
| 2002/0181516 A1 * | 12/2002 | Kamath | ....................... | 372/20 |
| 2002/0181521 A1 * | 12/2002 | Crowder et al. | .......... | 372/38.02 |
| 2003/0007524 A1 * | 1/2003 | Gotoda | ........................ | 372/20 |

(Continued)

OTHER PUBLICATIONS

Larry A. Coldren et al., "Tunable Semiconductor Lasers: A Tutorial", Journal of Lightwave Technology, vol. 22, No. 1, Jan. 2004, pp. 193-202.

Mitsuhiro Teshima, "Dynamic Wavelength Tuning Characteristics of the 1.5- μm Three-Section DBR Lasers: Analysis and Experiment", IEEE Journal of Quantum Electronics, vol. 31, No. 8, Aug. 1995, pp. 1389-1400.

(Continued)

Primary Examiner—Jerome Jackson, Jr.
Assistant Examiner—Hrayr A. Sayadian
(74) Attorney, Agent, or Firm—Svetlana Z. Short; Ronald J. Paglierani (57) ABSTRACT

The present invention is directed to a method and system for providing phase modulated current to a semiconductor laser to control beam wavelength. A first current is received into a gain portion of the semiconductor laser and a second current is received into a DBR portion of the semiconductor laser. The second current is phase modulated based upon a required intensity value. An output beam is generated by the semiconductor laser based upon the received first current and the received second current.

22 Claims, 9 Drawing Sheets

U.S. PATENT DOCUMENTS

| | | |
|---|---|---|
| 2003/0035455 A1* | 2/2003 | Steffens .................... 372/50 |
| 2003/0072344 A1* | 4/2003 | Lam et al. .................. 372/50 |
| 2003/0147442 A1* | 8/2003 | Larson et al. ............... 372/50 |
| 2003/0161370 A1* | 8/2003 | Buimovich et al. .......... 372/50 |
| 2004/0008937 A1* | 1/2004 | Mahgerefteh et al. ........ 385/37 |
| 2004/0096221 A1* | 5/2004 | Mahgerefteh et al. ........ 398/85 |
| 2005/0111852 A1* | 5/2005 | Mahgerefteh et al. ....... 398/187 |
| 2006/0239306 A1* | 10/2006 | Donohoe et al. ............ 372/20 |
| 2007/0071055 A1* | 3/2007 | Fujii ...................... 372/50.11 |

OTHER PUBLICATIONS

Teshima, Mitsuhiro, "Dynamic Wavelength Tuning Characteristics of the 1.5- μm Three-Section DBR Lasers: Analysis and Experiment", IEEE Journal of Quantum Electronics, vol. 31, No. 8, Aug. 1995, p. 1389-1400.

Coldren, Larry A. et al., "Tunable Semiconductor Lasers: A Tutorial", Journal of Lightwave Technology, vol. 22, No. 1, Jan. 2004, p. 193-202.

* cited by examiner

METHOD AND DEVICE FOR PERFORMING WAVELENGTH MODULATION WITH DISTRIBUTED BRAGG REFLECTOR (DBR) LASER

BACKGROUND OF THE INVENTION

1. Field of the Invention

The present invention relates generally to a method and device to perform wavelength modulation and more specifically to a method and system for controlling current injection into a Distributed Bragg Reflector (DBR) semiconductor laser to perform wavelength modulation.

2. Background

Lasers have been employed in display technologies for years. In displays such as computer displays, televisions, or the like, colors are generated by the superposition of three primary colors: red, blue and green. As such, within laser-based displays, lasers are employed to provide the primary colors. Each laser can be raster-scanned across the screen or can be stationary and employed to illuminate an image (e.g., a motion picture film or spatial light modulator containing an image). The ability of a laser to provide a beam having excellent brightness characteristics leads to efficient and well-performing lasers within laser-based projectors, when compared to the brightness characteristics of incandescent bulbs used in conventional motion picture theaters.

DBR semiconductor lasers can be used for laser-based displays, among other applications, as they can provide efficient wavelength conversion. For example, a 1060 nm DBR semiconductor laser tuned to a spectral center of a second-harmonics-generation (SHG) device such as a non-linear crystal may be used to convert the wavelength output by the DBR semiconductor laser to a 530 nm beam. This provides a low-cost, compact and efficient non-linear source of green light. Generally, for technologies involving video displays, the optical power such as that used to generate the intensity of green light, for example, needs to be modulated at a fundamental frequency of approximately 50 MHz and with an extinction ratio of approximately 40 dB. The extinction ratio is the ratio of high optical power level to low optical power level. To achieve this combination of high modulation speed and larger extinction ratio remains a daunting task.

One way to obtain a DBR laser and second harmonic generator (SHG) based light source having a fast modulation and a large extinction-ratio is to rapidly modulate the output wavelength of a DBR semiconductor laser. As a result, the DBR semiconductor laser beam rapidly scans cross the narrow spectral width of a non-linear SHG device to produce the necessary intensity modulation. For example, if maximum green power is needed, the DBR wavelength is tuned to the spectral center of the non-linear crystal while, if zero green power is needed 10 ns later, the DBR wavelength is tuned outside the spectral width of the non-linear crystal to provide a dark image.

Figure 1A:
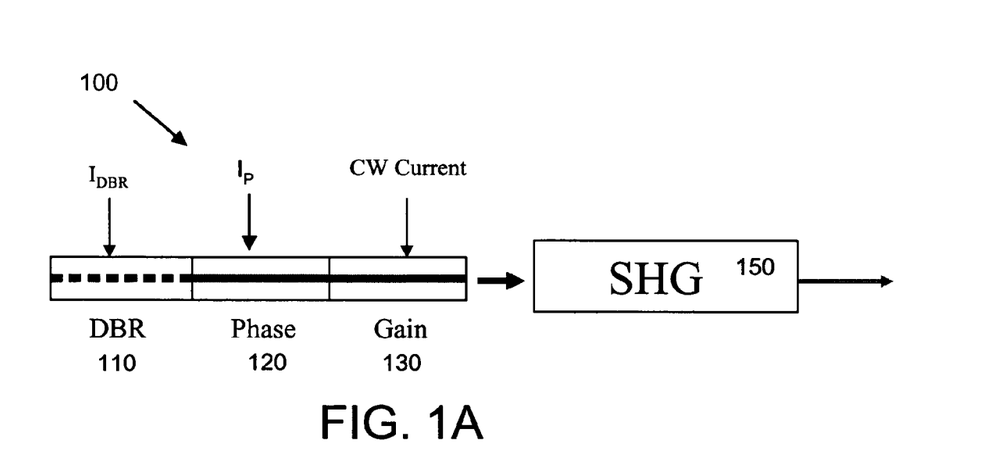
FIG. 1A is schematic diagram of a conventional 3-portion DBR semiconductor laser and an SHG device.

FIG. 1A schematically illustrates a conventional DBR semiconductor laser 100 and a second harmonic generation (SHG) device 150. The DBR semiconductor laser 100 includes a DBR potion 110, a phase portion 120 and a gain portion 130. The gain portion 130, when injected with a continuous wave (CW) current, generates continuous optical power for the laser. The current injected into the DBR potion 110 makes large changes to wavelengths output from the laser and the current into the phase portion 120 makes small changes to the wavelength of the beam output of the laser. The SHG device 150 receives the beam produced by the semiconductor laser 100, whose output intensity of the converted wavelength (green, for example) depends upon alignment of the DBR laser wavelength and the SHG device's spectral center. The beam output from the SHG device 150 is then directed to an output such as display screen.

Figure 1B:
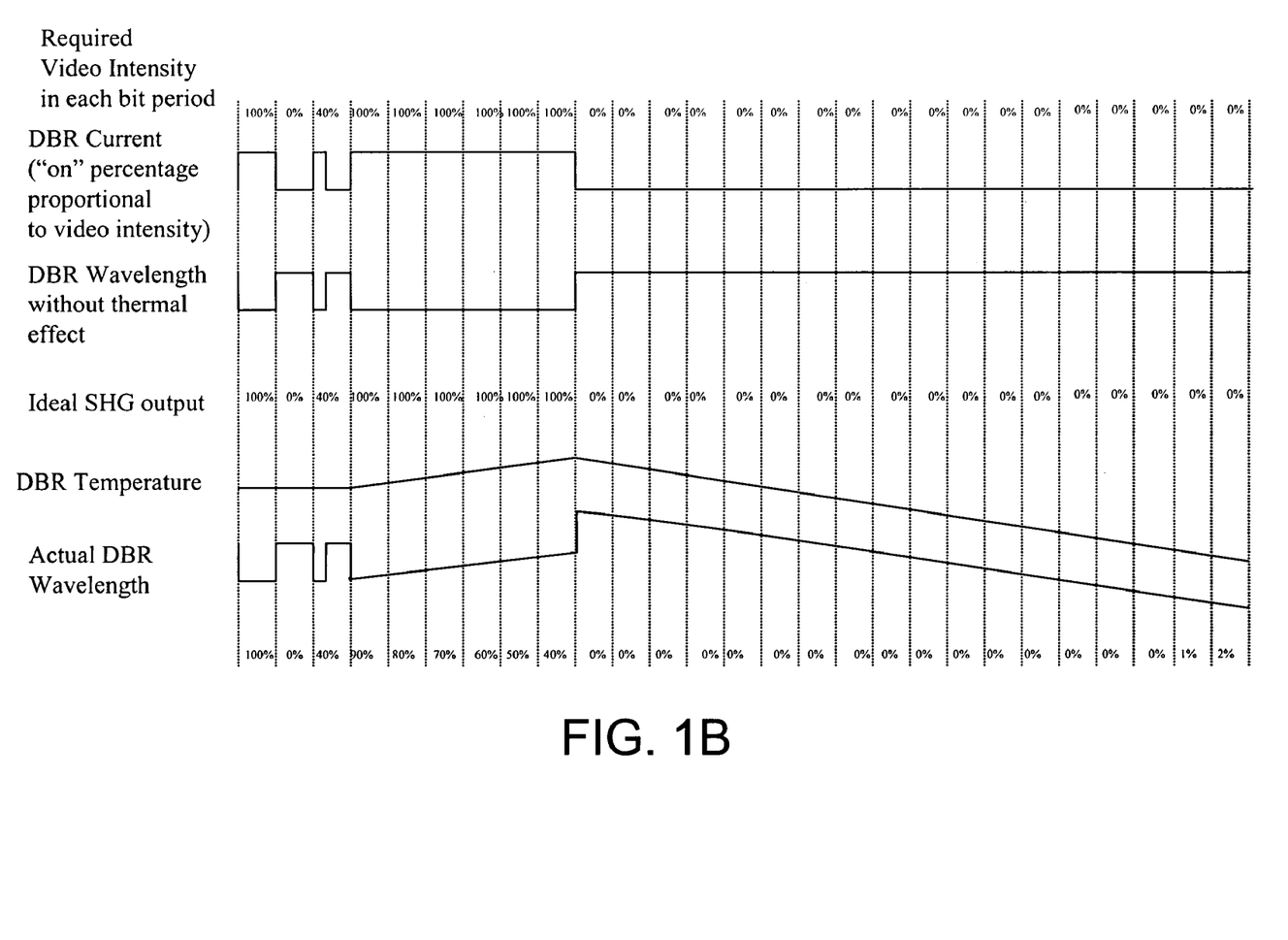
FIG. 1B is a chart illustrating various characteristics of the DBR semiconductor laser of FIG. 1A.

The simplest way to rapidly tune the DBR semiconductor laser's output wavelength is by injecting modulated current into the DBR portion and phase portion of the DBR semiconductor laser 100 while keeping the gain-portion current continuous and constant. As illustrated in the chart provided in FIG. 1B, a video signal can require green light with an intensity of up to 100% within each bit period of the signal. The bit period width is the inverse of the system frequency, for example, the resident time of each pixel of a raster scan on a display screen. For the example shown in FIG. 1B, an intensity of 100% is the brightest possible signal while 0% is dark. Thus, as illustrated in FIG. 1B, the video intensity required for the first bit period is 100%, the intensity reduces to 0% for the second bit period and is increased to 40% for the third bit period.

With conventional systems, the current injected into the DBR portion 110 of the laser is pulse width modulated based on the required intensity in each bit period. That is, the duration within one bit period in which the current is "on" is proportional to the intensity of the video signal in that bit period (shown in the first waveform from the top of FIG. 1B). Ideally, the wavelength of the output of a DBR semiconductor laser is shifted based on the carrier induced effect and output to the SHG device 150 (shown in the second waveform from the top of FIG. 1B). The SHG device 150, based upon the received beam, outputs a converted beam having an ideal intensity signal for display, as illustrated in FIG. 1B. However, the simple scheme described above ignores the possible adverse thermal effect that the injection of current into the laser causes.

Generally, current injection generates two effects within DBR semiconductor lasers. First, a carrier effect is generated that provides more carriers in the portion increasing carrier density and reducing the refractive index within the DBR portion or the phase portion. As a result, a shorter wavelength beam is generated. Current injection also causes a heating effect which causes the temperature of the semiconductor laser device to rise. Currents higher than zero cause a temperature rise in the DBR portion and the phase portion of the laser, thereby increasing the refractive indices, which tend to generate a longer wavelength beam. The collective wavelength shift is produced by the combined effect of the carrier effect and thermal effect. For large current values that are needed to achieve large wavelength shift, the temperature rise is severe enough to reduce and sometimes completely reverse the carrier-induced wavelength shift.

Figure 2:
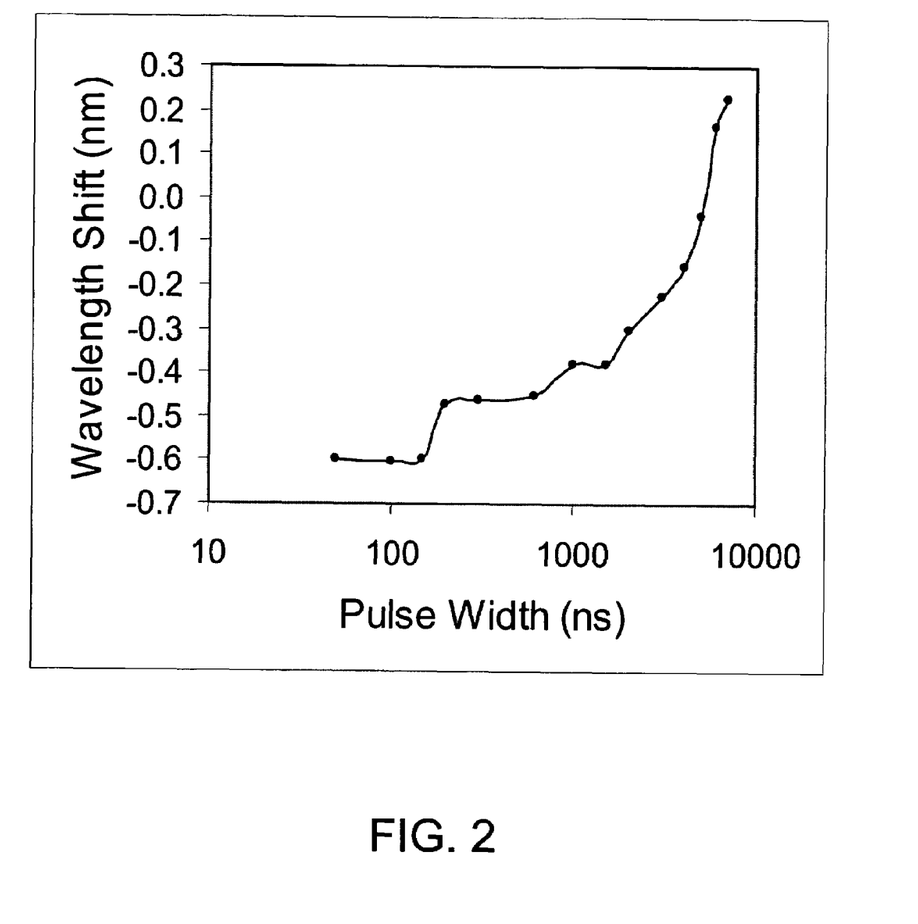
FIG. 2 illustrates a wavelength shift as a function of DBR pulse width of a DBR semiconductor laser when subjected to the current injection thermal effect.

FIG. 2 illustrates the effect that the injection of current, and the resulting increase in temperature, can have on the operation of the laser. Specifically, FIG. 2 shows the wavelength shift provided by the laser as a function of the DBR-portion current-pulse width, measured at the end of each current pulse width. The wavelength shift induced by the carrier effect is approximately −0.6 nm. This is shown in the lower left portion of the graph where the pulse width is approximately 150 ns or less. However, when the pulse width of the injection current increases beyond 150 ns, the heating effect discussed above begins to reduce the effects of the carrier effect. In fact, if the current pulse becomes long enough, the carrier effect becomes entirely negated by the heating effect.

Another drawback of current induced thermal effect is that it provides a slow wavelength modulation process. The thermal effect, which causes the temperature of the laser to increase, has μs- to ms- characteristic time compared to the carrier effect that has ns- carrier lifetime. The degree of thermal effect also depends upon the current amplitude and the heat sinking conditions associated with the laser. The slow response of the thermal effect is also illustrated in FIG. 2, as the wavelength shift does not change for pulse widths of less than 150 ns. Slow thermal effect results in an undesirable patterning effect because the average heating depends upon the width of pulses and therefore on the pattern of the video signal. In other words, the DBR semiconductor laser wavelength at a particular bit of the video signal depends on the history of the previous bits of data.

The adverse effects resulting from a temperature rise in the laser are also shown in the chart of FIG. 1B. Specifically, when injection current is applied to the DBR portion 110 of the DBR semiconductor laser 100, and the current is constantly on, the DBR temperature rises as shown by the DBR temperature waveform in FIG. 1B. As a result, the actual DBR wavelength waveform provided from the laser to the SHG device 150 will be distorted, and the resulting output from the SHG device 150 will also be distorted, and the required intensity of the original video signal is not achieved at the output of the SHG device 150.

SUMMARY OF THE INVENTION

Accordingly, what is needed is a device that minimizes the thermal effect associated with the injection of current into the DBR portion of a DBR semiconductor laser while providing proper wavelength modulation.

Thus in accordance with an exemplary embodiment of the present invention a method for providing phase modulated current to a semiconductor laser is disclosed. A first current is received into a gain portion of the semiconductor laser and a second current is received into a DBR portion of the semiconductor laser. The second current is phase modulated based upon a required intensity value. An output beam is generated by the semiconductor laser based upon the received first current and the received second current.

In accordance with another exemplary embodiment of the present invention a system for providing phase modulated current to a semiconductor laser to control wavelength modulation of a beam generated by the laser. A controller obtains a required intensity value and current sources inject a first current into a gain portion of the semiconductor laser and a second current into a DBR portion of the semiconductor laser. The second current is phase modulated with respect to the first current, based upon the required intensity value and the laser generates an output beam having a wavelength modulated based upon a phase differential between the first current and the second current.

BRIEF DESCRIPTION OF THE DRAWINGS

The above and other aspects, features and advantages of this invention will be described in relation to the following figures in which like reference characters refer to the same parts throughout the different views.

DETAILED DESCRIPTION

An exemplary embodiment of the present invention relates to a method and associated system to enable efficient operation of a DBR semiconductor laser and to reduce the thermal effects associated with semiconductor lasers. Although specific embodiments will be illustrated and described herein with regard to controlling the phase modulation of individual currents injected into the separate portions of a DBR semiconductor laser in order to perform wavelength modulation, it should be appreciated by those of ordinary skill in the art that such a system and method would also be advantageous, for example, in applications for any semiconductor laser device in which current injection can cause adverse thermal effects.

Additionally, while the DBR semiconductor laser of the present invention is employed within an application directed to video signal processing and display, this disclosure is intended to cover any adaptations or variations of the present invention that generally relate to semiconductor lasers. For example, this invention can also be employed in such areas as optical data storage, image reproduction, optical communications as well as sensing instruments and the like.

In the following detailed description of the exemplary embodiments, reference is made to the accompanying drawings that form part hereof, and in which is shown by way of illustration, specific exemplary embodiments in which the invention may be practiced. These embodiments are described in sufficient detail to enable those skilled in the art to practice the invention, and it is to be understood that other embodiments may be utilized and that logical, mechanical and/or electrical changes may be made without departing from the spirit and scope of the present invention. The following detail description is therefore not to be taken in a limiting sense.

Figure 3:
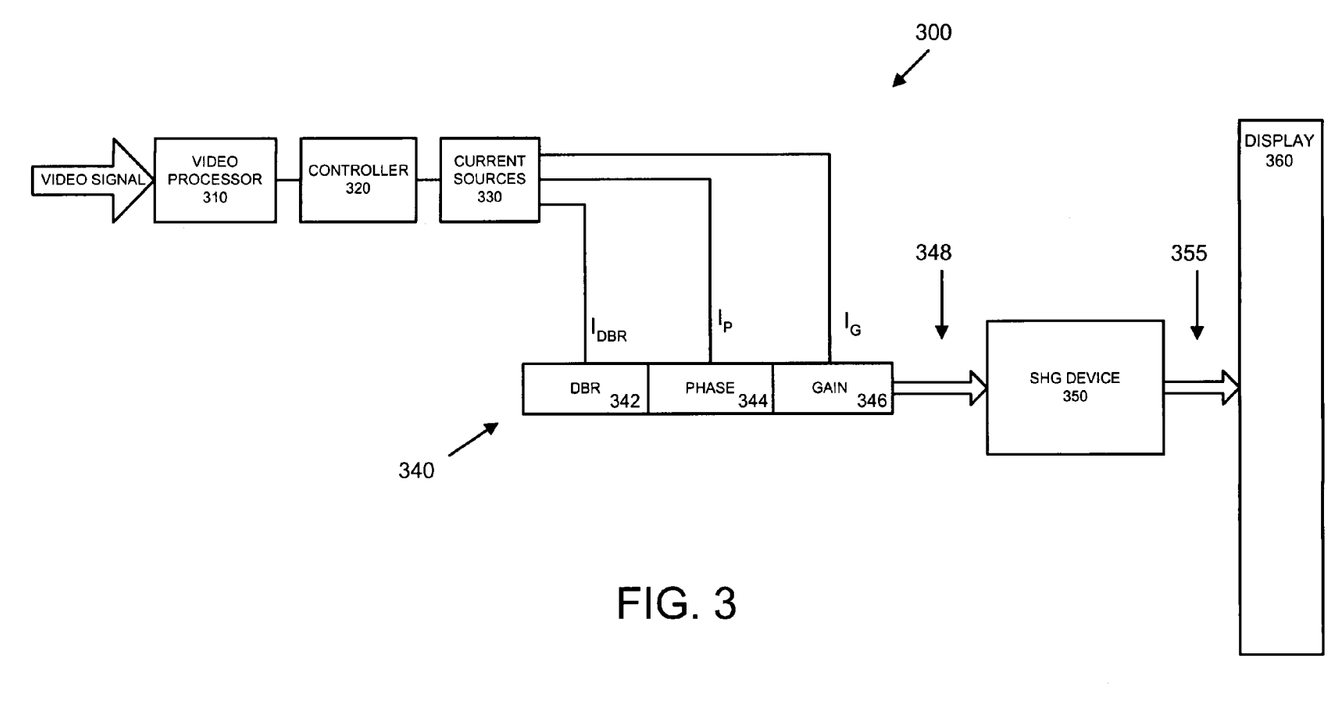
FIG. 3 illustrates an exemplary video display system employing the injection current phase shift of the present invention

In accordance with an exemplary embodiment of the present invention, phase modulated current injection into a DBR semiconductor laser can be efficiently employed within a video display system, as shown generally in FIG. 3. The video system 300 includes a video data processor 310, a controller 320, current sources 330 a DBR semiconductor laser 340, a second harmonic generator (SHG) device 350, and a display device 360. One of ordinary skill would understand that, while only one DBR semiconductor laser is shown in the FIG. 3 embodiment, numerous DBR semiconductor lasers (for different wavelength outputs) could be employed and similarly controlled to provide an output for display.

Additionally while an SHG device 350 is discussed in accordance with exemplary embodiments, other types of wavelength-selective devices could be employed to provide an output. For example, passive optical filters could also be employed. Passive optical filters do not convert the wavelength of the output from a laser while providing an beam having an intensity.

The video data processor 310 receives a video signal and processes the information contained in the signal for display. The video data processor 310 can further include other known video processing elements such as a video converter (not illustrated) that converts common types of picture signals such as video, analog RGB computer graphics, or the like into digital RGB data. The video data processor 310 additionally can, through known methods, determine a video intensity signal associated with a received video signal for each bit period. This signal can be used by the controller 320 and the current source 330 to provide wavelength modulation to the beam 348 output from the DBR semiconductor laser 340.

The controller 320 can be, for example, a microprocessor based controller that, in conjunction with a memory can be employed to control the phase modulation of current sources 330. The current sources 330 provide a plurality of separately controllable currents, $I_{DBR}$, $I_P$ and $I_G$, with the specific ability to provide phase modulation of output currents.

The DBR semiconductor laser 340 is a known semiconductor laser, for example, a 1060 nm DBR semiconductor laser. The DBR semiconductor laser comprises three individual portions: a DBR portion 342, a phase portion 344 and a gain portion 346. The output beam 348 generated by the DBR semiconductor laser 340 is tuned by injecting current into the DBR portion 342 to the spectral center of a SHG device 350 which is used to convert the wavelength output from the DBR semiconductor laser 340 to 530 nm, thereby providing a low-cost, compact and efficient source for green light 355 for application to the display 360. The second harmonic generator 350 has a very narrow bandwidth of 0.1 to 0.2 nm. Thus, if the current is reduced to zero and the DBR semiconductor laser output wavelength returns to the initial wavelength, such a shift of 0.6 nm causes the beam to be shifted out of the narrow bandwidth of the SHG device 350 and thus reduces or eliminates the intensity of the output beam of green light 355 from the SHG device 350. Alternatively, the SHG device can also be set so that if the current is reduced to zero and the laser output returns to the initial wavelength, such a shift would cause the beam to be shifted into the bandwidth of the SHG device 350 to increase or maximize the intensity of the output beam of green light 355 from the SHG device 350.

In accordance with the present invention, the controller 320 employs a control scheme, to effectively control the injection currents $I_{DBR}$, $I_P$ and $I_G$ input to the laser so that the beam generated by the laser has a wavelength shift unaffected by the thermal effect.

Figure 4A:
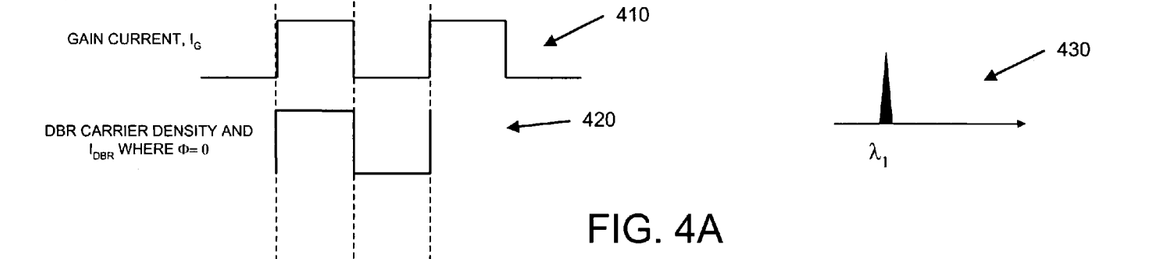
FIGS. 4A, 4B and 4C illustrate characteristics associated with the wavelength modulation scheme of the present invention.
Figure 4B:
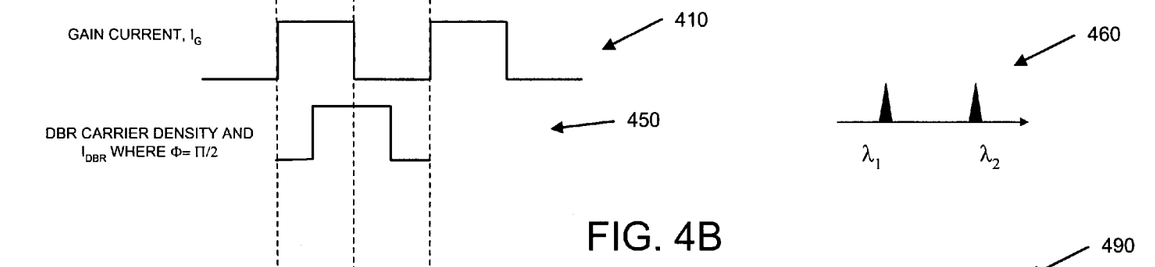
Figure 4C:
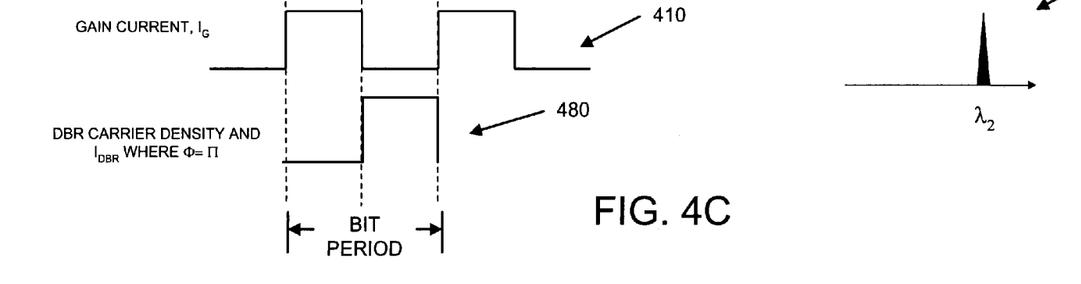
Figure 7A:
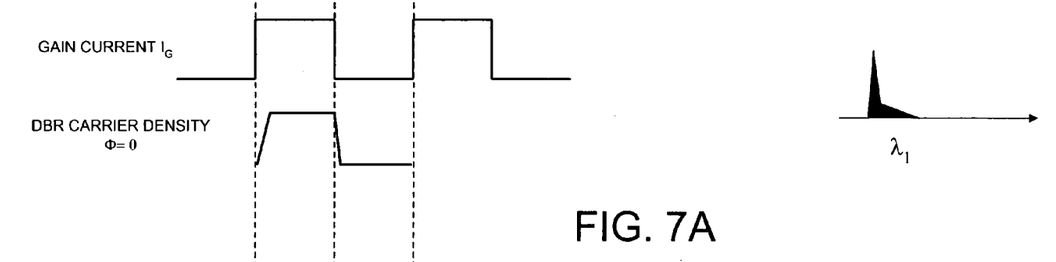
FIGS. 7A, 7B and 7C illustrate characteristics associated with a wavelength modulation scheme of the present invention with a non-ideal square wave DBR portion carrier density waveform taking into account the carrier lifetime in the DBR portion.
Figure 7B:
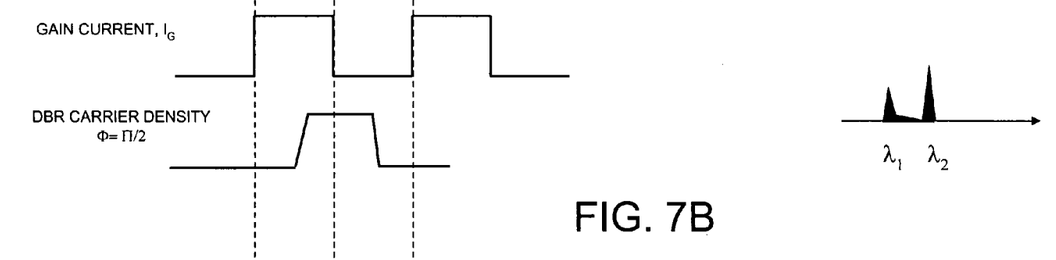
Figure 7C:
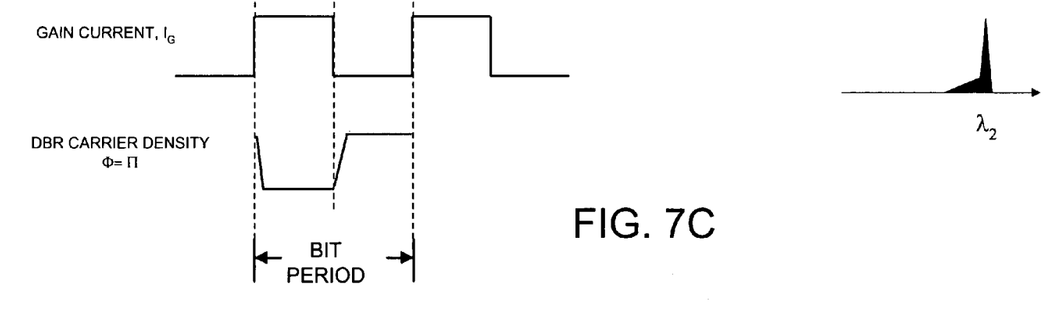
Figure 8A:
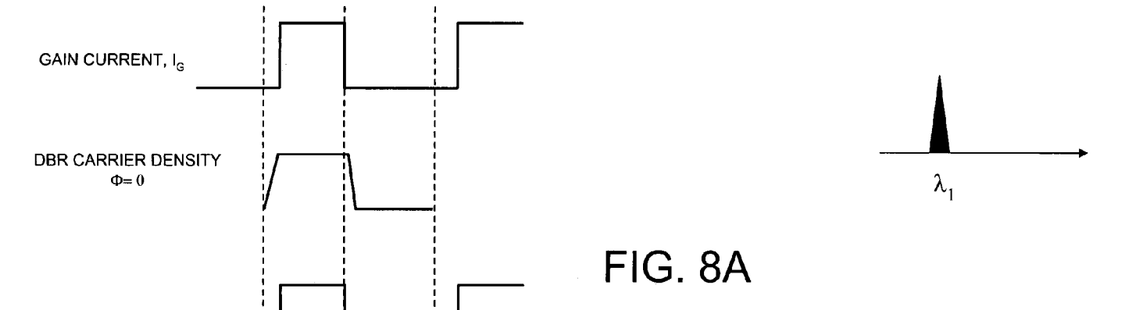
FIGS. 8A, 8B and 8C illustrate characteristics associated with a wavelength modulation scheme of the present invention with a non-ideal square waveform due to carrier lifetime having less than 50% duty cycle gain-portion current.
Figure 8B:
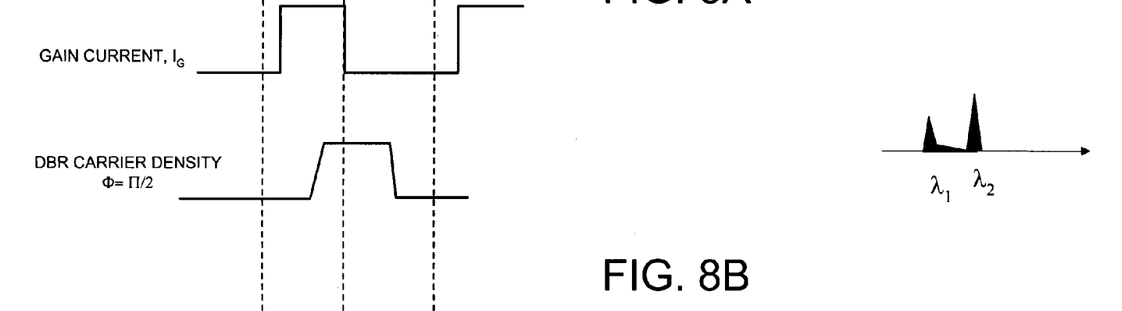
Figure 8C:
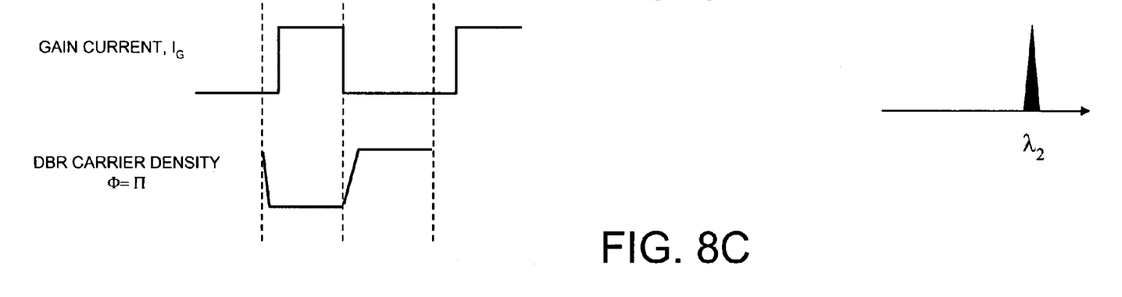

FIGS. 4A, 4B, and 4C illustrate ideal characteristics of current and DBR carrier density when current is injected into the gain portion 346 and DBR portion 342 of the semiconductor laser 340 in accordance with the present invention. The "on" part of the gain portion corresponds to a current value above a threshold current and "off" part of the gain portion current corresponds to a current value slightly below the threshold current. The threshold current is the point at which a laser's stimulated output is generated. Therefore the carrier density in the gain portion is almost constant. Note that the carrier density waveform of the DBR portion has ideal square wave shape with negligible rise and fall time, the same as the DBR portion current $I_{DBR}$. In reality, with regard to the DBR portion 342 or phase portion 346 of semiconductor laser 340, the carrier lifetime is the slower spontaneous carrier lifetime and sometimes can not be ignored, resulting in non-ideal square-wave DBR carrier-density waveform with rise and fall time. These non-ideal waveforms are illustrated in FIGS. 7 and 8 and discussed below. However, with regard to FIGS. 4A, 4B, and 4C, only the ideal DBR carrier density waveshapes and current wave shapes have been illustrated.

In accordance with the present invention, both the gain-portion current and DBR-portion current are modulated with a 50% duty cycle (i.e., the amount of time that a current is "on" within a bit period) at the fundamental video frequency. At a 50% duty cycle, the time-average thermal loads are constant and the temperatures of the gain portion and DBR portion are constant values within one bit period and, thus, over many bit periods. By maintaining a constant duty cycle, for example of at 50%, any adverse effects associated with temperatures of the laser over time are eliminated.

In accordance with the present invention, a phase shift of the injected DBR current is provided for each bit period. The phase difference between the DBR current and the gain current in units of degree is defined as: $\phi = \delta t/T * 360$, where $\delta t$ is the time delay between the rise edge of the DBR current and the rise edge of the gain current, T is the duration of a bit period. The phase difference between the DBR current and the gain current corresponds to the required intensity of the received video signal. The control scheme, employed by the controller 330 illustrated in the video system of FIG. 3, enables efficient control of the phase, $\phi$, between the gain-portion current and DBR-portion current, within each bit period. The controller 320 performs phase control during each bit period, independently of the previous bit periods and later bit periods.

As shown in FIG. 4A, a gain current waveform 410 and a DBR carrier-density waveform 420 are induced by associated currents $I_G$ and $I_{DBR}$ (with identical characteristic waveforms) injected into each portion of the DBR semiconductor laser 340. The spectral graph 430 shown in FIG. 4A illustrates the ideal spectral density generated by the DBR semiconductor laser during one bit period. In accordance with the present invention, the bit period is approximately 5 ns to 150 ns, in order to avoid temperature change within one bit period. With each bit period being small, 20 ns for example, use of constant duty cycle of the pulse current within a bit period guarantees the average heating to be constant, causing no temperature rise for each of the gain, DBR and phase portions.

To shift the DBR semiconductor laser wavelength to $\lambda_1$ (where $\lambda_1$ is the spectral center of the SHG device), the phase differential between the DBR portion current and the gain portion current is set to $\phi = 0$ (shown in FIG. 4A). As a result, there is 100% overlapping between the DBR-portion current and gain-portion current (as well as DBR carrier densities). The corresponding spectral density is shown by the spectral wave form 430 and, at $\lambda_1$, where the intensity of the beam is maximized. The modulated beam is applied to the SHG device 350. As a result, the intensity of the beam output from the SHG device 350 is also at a maximum intensity.

As shown in FIG. 4B, by shifting the DBR injection current (a 90° shift is shown in the DBR carrier waveform 450), partial overlapping occurs between the DBR-portion current and gain-portion current waveforms, and the optical power is distributed between $\lambda_1$ and $\lambda_2$. That is, a difference in phase between the two waveforms results in a frequency spectra with multiple wavelengths. As a result of this distribution of optical power between multiple wavelengths (as illustrated in the spectral graph 460), the intensity of the beam output from the SHG device 350 is less than a maximum intensity. In other words, since the SHG device 350 has a spectral center at $\lambda_1$, the optical power at $\lambda_2$, residing outside the narrow bandwidth of the SHG device 350, is not converted by the SHG device 350, thereby resulting in a less intense beam output from the SHG device. While not specifically shown, numerous other wavelengths can be generated based upon a required video signal intensity of the received video signal.

As shown in FIG. 4C, by setting the phase difference between the DBR current 480 and the gain portion current 410 to 180°, a 0% overlap between the DBR-portion current and gain-portion current results. The optical power is thereby shifted completely to $\lambda_2$ as illustrated in the spectral graph 490. Thus, when the generated beam 348 is applied to the SHG device 350 (where $\lambda_1$ is the spectral center of the SHG device), the intensity of the beam 355 output from the SHG device 350 is at a minimum intensity as the intensity of the DBR output beam 348 at $\lambda_1$ is negligible.

While the exemplary embodiment shown with regard to FIGS. 4A, 4B and 4C only illustrate DBR semiconductor laser operation when $\lambda_1$ is the spectral center of the SHG device, it is also possible to align the spectral center of the non-linear crystal to the non-shifted wavelength $\lambda_2$. If $\lambda_1$ is the spectral center of an SHG device, changing of phase $\phi$ varies the intensity of DBR semiconductor laser output at $\lambda_1$. With the video signal applied to $\phi$, the wavelength-converted optical power is intensity-modulated as required by the video signal.

Figure 5:
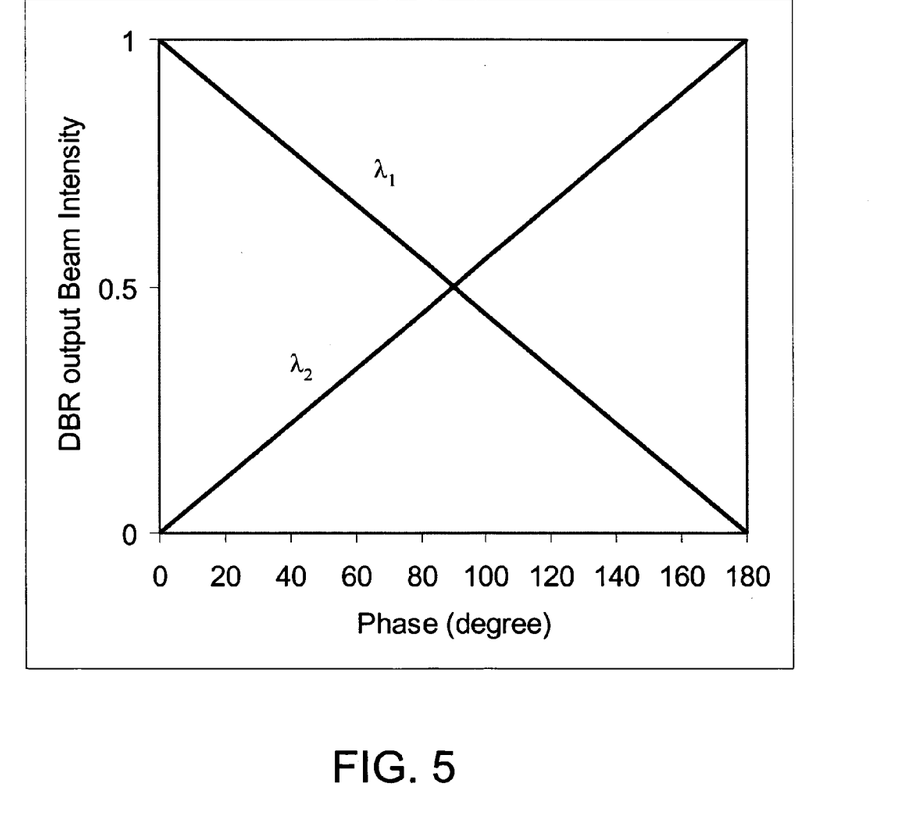
FIG. 5 illustrates the optical intensity of a DBR semiconductor laser as a function of phase between gain portion current and DBR portion current in accordance with the present invention.

A more complete diagram illustrating the wavelength modulation scheme of the present invention is disclosed in FIG. 5. The diagram specifically shows intensity at $\lambda_1$ and $\lambda_2$ as a function of phase between gain portion current and DBR portion current. This scheme can be employed by the controller 330 of the present invention to control the current injection to the DBR semiconductor laser. For example, the data associated with the illustrated chart can be stored in a memory associated with the controller. When a required intensity is determined from a video signal, the controller can provide the required phase differential to the current sources 330 for current injection and wavelength modulation. For example, if $\lambda_1$ is the spectral center of the SHG device, the intensity of the output beam from the SHG to a video screen (and thus the required intensity) is a function of the phase between the gain portion current and the DBR portion current will be of the same shape as the curve of $\lambda_1$ in FIG. 5.

The embodiment illustrated in FIGS. 4A, 4B and 4C considers adjusting the position of the DBR-portion current pulse in order to change the phase between the gain-portion current pulse and the DBR-portion current pulse within one bit period. However, it is possible to change the position of the gain-portion current pulse or change the positions of both current pulses in order to change the relative phase. Moreover, the example above considers only the gain-portion and DBR-portion currents for large-step wavelength tuning. However, similar results can also be obtained by applying pulsed current to the phase portion and changing the phase between the gain-portion and phase-portion currents. The phase modulation for the phase portion is the same as the DBR portion, as described above. Accordingly, the DBR semiconductor laser can rapidly be wavelength-modulated in fine steps as provided by the phase portion.

Figure 6:
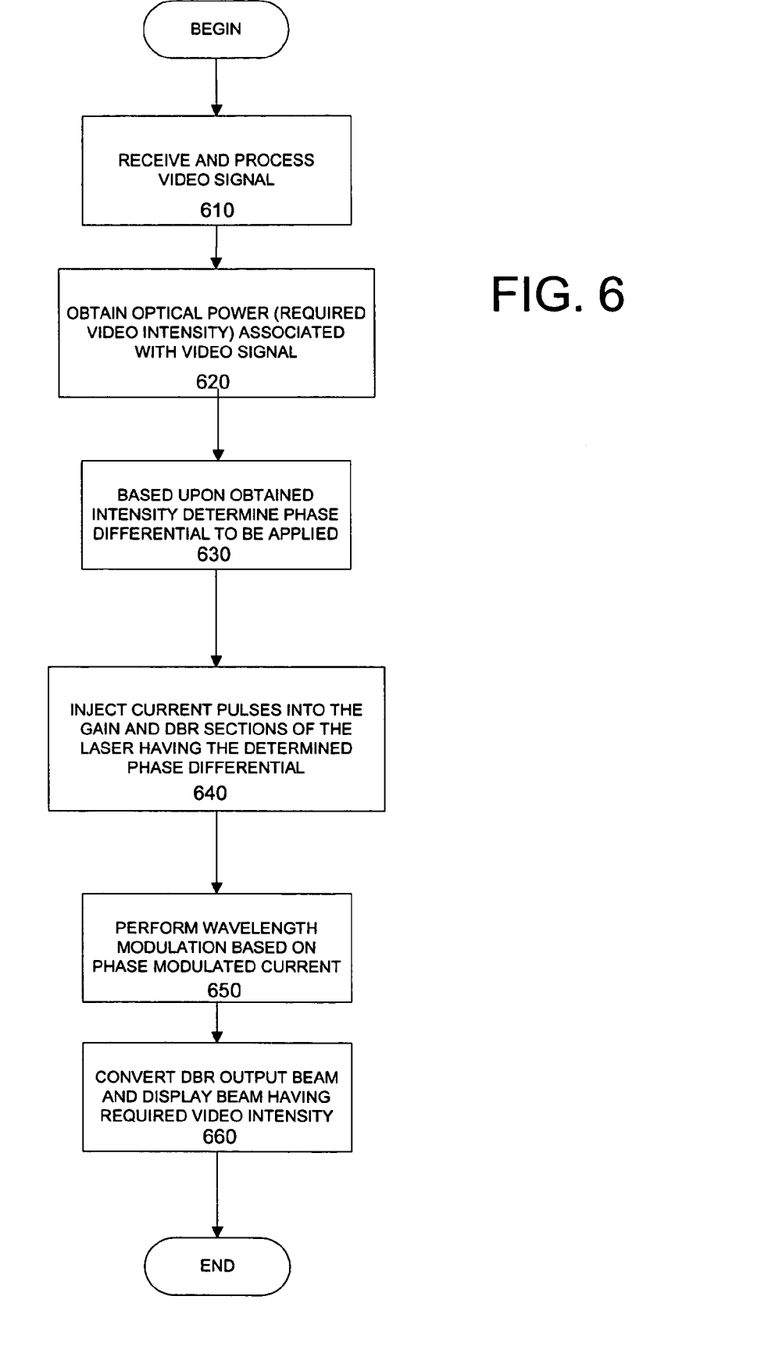
FIG. 6 illustrates a flow diagram providing a method of wavelength modulation in accordance with the present invention.

Thus, in accordance with the present invention a method of modulating the DBR semiconductor laser wavelength output is provided in the flow diagram provided in FIG. 6. In step 610, the system (illustrated in FIG. 3) receives and processes the video signal. The required optical power (video intensity) associated with the video signal is obtained for a bit period in step 620. In step 630, the controller 320 receives the required optical power associated with the received video signal and determines an appropriate injection current phase shift to be applied (as illustrated in FIG. 5, for example).

In step 640, pulsed currents are injected into the gain portion and DBR portion of the DBR semiconductor laser having the determined phase differential. Alternatively, as discussed above, pulsed currents could also be injected into the phase and gain portions of the DBR semiconductor laser having the determined pulse differential. In step 650, the DBR semiconductor laser generates a beam at modulated wavelength having an optical power based upon the required video intensity. In step 660, the beam is converted to a primary color (green for example) by the SHG device 350, and provides the required optical power to the display 360.

If the DBR-portion carrier-density waveform is not an ideal square wave and has a fall or rise time greater than zero, as illustrated in FIGS. 7A, 7B, and 7C, the spectral density at $\lambda_1$ is spread more than the ideal square wave case (see FIGS. 4A, 4B and 4C). As a result, conversion efficiency and the extinction ratio are reduced. In order to improve the extinction ratio and the spectral width, the duty cycle can be further reduced to less than 50% for the gain-portion current, as illustrated in FIGS. 8A, 8B and 8C. Note that with regard to FIGS. 7A, 7B, and 7C as well as 8A, 8B and 8C, the characteristics of the injection current to the DBR portion, $I_{DBR}$, is the same as the characteristics of the injection current to the DBR portion shown in FIGS. 4A, 4B and 4C, respectively.

The present invention provides several distinct advantages over conventional systems. By employing the present invention, under high-frequency square-wave current pulse injection, the junction temperatures of the gain portion, DBR portion and phase portions are constant. By changing the phase between the gain-portion current pulse and the DBR-portion current pulse, or the phase between the gain-portion current pulse and the phase-portion current pulse, within each bit period, one can produce desirable carrier-induced wavelength shift without the limitation of the thermal effect.

While the present invention has been illustrated with a 3-portion DBR semiconductor laser for use in video signal processing, other variation of DBR semiconductor lasers such as the sampled-grating DBR (SG-DBR) lasers and grating-assisted codirectional coupler with rear sampled-grating reflection (GCSR) lasers can also be employed.

It is, therefore, apparent that there has been provided, in accordance with the present invention, a method and system for wavelength modulation. While this invention has been described in conjunction with a number of illustrative embodiments, it is evident that many alternatives, modifications, and variations would be or are apparent to those of ordinary skill in the applicable arts. Accordingly, the disclosure is intended to embrace all such alternatives, modifications, equivalents and variations that are within in the spirit and scope of this invention.

What is claimed is:

1. A method for providing phase modulated current to a semiconductor laser, comprising:
   receiving a first current into a gain portion of the semiconductor laser;
   phase modulating a second current relative to said first current, based upon required nonzero wavelength modulation, and changing the phase difference between said first current and said second current;
   receiving the second current into a DBR portion of the semiconductor laser; and
   generating an output beam by the semiconductor laser based upon the received first current and the received second current.

2. The method of claim 1, wherein the first current maintains a constant duty cycle.

3. The method of claim 2, wherein the duty cycle is 50% or less.

4. The method of claim 1, wherein the second current maintains a constant duty cycle.

5. The method of claim 4, wherein the duty cycle is 50% or less.

6. The method of claim 1 further comprising:
converting the output beam generated from the semiconductor laser at a device and having an output intensity modulated due to the wavelength modulation of the semiconductor laser.

7. The method of claim 6, wherein the device is a second harmonic generation device which does change the wavelength of the output beam of the semiconductor laser.

8. The method of claim 6, wherein the device is a passive optical filter device that does not change the wavelength of the output beam of the semiconductor laser.

9. The method of claim 2, wherein a bit period associated with the duty cycle is 5 ns to 150 ns.

10. The method of claim 4, wherein a bit period associated with the duty cycle is 5 ns to 150 ns.

11. A system for providing phase modulated current to a semi-conductor laser to control wavelength modulation of a beam generated by the laser, comprising:
a controller structured to obtain a required intensity value and to convert it to a phase differential value;
current sources structured to inject a first current into a gain portion of the semiconductor laser and a second current into a DBR portion of the semiconductor laser,
a phase modulator operatively connected to said current sources, said phase modulator structured to (i) phase modulate said second current with respect to said first current, and (ii) provide a changing phase differential value $\Phi$ between the first current and the second current,
so that the laser generates an output beam that is wavelength modulated based upon the changing phase differential value $\Phi$ between the first current and the second current.

12. The system of claim 11, wherein the first current maintains a constant duty cycle.

13. The system of claim 12, wherein the duty cycle is 50% or less.

14. The system of claim 11, wherein the second current maintains a constant duty cycle.

15. The system of claim 14, wherein the duty cycle is 50% or less.

16. The system of claim 11 further comprising:
a converter that converts the output beam generated from the semiconductor laser to a beam having an output intensity modulated due to the wavelength modulation of the semiconductor laser.

17. The system of claim 16, wherein the converter is a second harmonic generation device which does change the wavelength of the output beam of the semiconductor laser.

18. The system of claim 16, wherein the converter is a passive optical filter device that does not change the wavelength of the output beam of the semiconductor laser.

19. The system of claim 12, wherein a bit period associated with the duty cycle is 5 ns to 150 ns.

20. The system of claim 14, wherein a bit period associated with the duty cycle is 5 ns to 150 ns.

21. A system for providing phase modulated current to a semiconductor laser to control wavelength modulation of a beam generated by the semiconductor laser, comprising:
a controller means for obtaining a required intensity value and converting it to a non-zero changing phase differential value between a first current and a second current, and for-phase modulating the second current with respect to the first current, based on the phase differential value; and
current source means for injecting (i) the first current into a gain portion of the semiconductor laser and (ii) the second current into a DBR portion of the semiconductor laser, said current means being operatively connected to said controller means,
the laser generating an output beam having a wavelength modulated based upon the phase differential value between the first current and second current.

22. The system of claim 21 further comprising:
converter means for receiving the beam output from the semiconductor laser and for generating a beam having an output intensity modulated due to the wavelength modulation of the semiconductor laser.

* * * * *